United States Patent
Wan et al.

(10) Patent No.: US 11,862,231 B2
(45) Date of Patent: *Jan. 2, 2024

(54) MEMORY DEVICE AND OPERATING METHOD THEREOF

(71) Applicants: TAIWAN SEMICONDUCTOR MANUFACTURING COMPANY, LTD., Hsinchu (TW); TSMC Nanjing Company Limited, Nanjing (CN); TSMC China Company Limited, Shanghai (CN)

(72) Inventors: He-Zhou Wan, Shanghai (CN); Xiu-Li Yang, Shanghai (CN); Mu-Yang Ye, Nanjing (CN); Yan-Bo Song, Shanghai (CN)

(73) Assignees: TAIWAN SEMICONDUCTOR MANUFACTURING COMPANY, LTD, Hsinchu (TW); TSMC NANJING COMPANY LIMITED, Nanjing Province (CN); TSMC CHINA COMPANY LIMITED, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/973,823

(22) Filed: Oct. 26, 2022

(65) Prior Publication Data
US 2023/0049698 A1  Feb. 16, 2023

Related U.S. Application Data

(63) Continuation of application No. 17/208,523, filed on Mar. 22, 2021, now Pat. No. 11,514,974.

(30) Foreign Application Priority Data

Feb. 9, 2021 (CN) .......................... 202110176842.2

(51) Int. Cl.
G11C 11/408 (2006.01)
G11C 5/06 (2006.01)
(Continued)

(52) U.S. Cl.
CPC .......... *G11C 11/4085* (2013.01); *G11C 5/063* (2013.01); *G11C 11/4074* (2013.01); *G11C 11/4087* (2013.01); *G11C 11/4094* (2013.01)

(58) Field of Classification Search
CPC . G11C 11/4085; G11C 5/063; G11C 11/4074; G11C 11/4087; G11C 11/4094
(Continued)

(56) References Cited

U.S. PATENT DOCUMENTS 7,548,463 B2 6/2009 Watanabe et al.
9,455,007 B2 9/2016 Lin et al.
(Continued)

FOREIGN PATENT DOCUMENTS

TW 200723306 A 6/2007

*Primary Examiner* — Huan Hoang
(74) *Attorney, Agent, or Firm* — Birch, Stewart, Kolasch & Birch, LLP

(57) ABSTRACT

A memory device includes a first transistor, a second transistor and a third transistor. The first transistor is coupled to a first word line at a first node. The second transistor is coupled to a second word line different from the first word line at a second node. A control terminal of the first transistor is coupled to a control terminal of the second transistor. The third transistor is coupled between a ground and a third node which is coupled to each of the first node and the second node. In a layout view, each of the first transistor and the second transistor has a first length along a direction. The first transistor, the third transistor and second transistor are arranged in order along the direction. A method is also disclosed herein.

20 Claims, 10 Drawing Sheets

(51) Int. Cl.
*G11C 11/4074* (2006.01)
*G11C 11/4094* (2006.01)

(58) Field of Classification Search
USPC .................................................. 365/230.06
See application file for complete search history.

(56) References Cited

U.S. PATENT DOCUMENTS

| | | |
|---|---|---|
| 11,514,974 B2 * | 11/2022 | Wan ...................... G11C 11/417 |
| 2012/0120702 A1 | 5/2012 | Browning et al. |
| 2016/0035397 A1 | 2/2016 | Pilo et al. |
| 2021/0334633 A1 | 10/2021 | Hwang |

\* cited by examiner

MEMORY DEVICE AND OPERATING METHOD THEREOF

CROSS-REFERENCE TO RELATED APPLICATION(S)

This application is a continuation application of U.S. application Ser. No. 17/208,523, filed on Mar. 22, 2021, which claims priority to China Application Serial Number 202110176842.2, filed Feb. 9, 2021, which is herein incorporated by reference.

BACKGROUND

Semiconductor memory devices include, for example, static random access memory (SRAM), and dynamic random access memory (DRAM). In some approaches, a SRAM device includes a SRAM array, and the SRAM array includes memory cells. The memory cells typically include transistors that are coupled to bit lines and word lines. The bit lines and word lines are used to read data from and write data to the memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
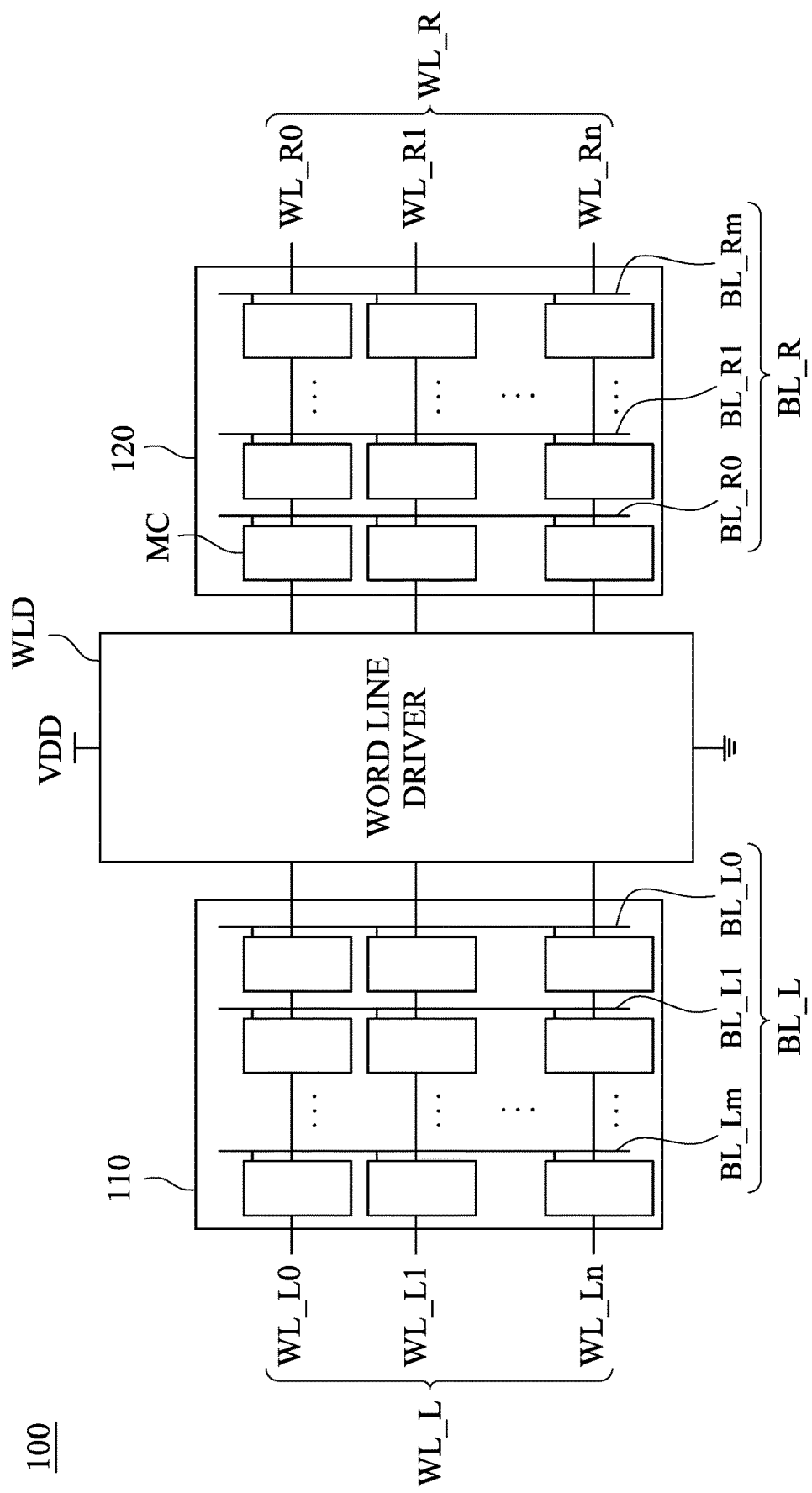
FIG. 1 is a schematic diagram of a memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

FIG. 1 illustrates a schematic diagram of a memory device 100, in accordance with some embodiments of the present disclosure. In some embodiments, the memory device 100 is implemented by static random access memory (SRAM). For illustration in FIG. 1, the memory device 100 includes an array of memory cells 110, an array of memory cells 120, and a word line driver WLD. The word line driver WLD is disposed and coupled between the array of memory cells 110 and the array of memory cells 120.

The word line driver WLD is coupled between a supply voltage terminal VDD and a reference voltage terminal which is, in some embodiments of the present disclosure, referred to as a ground. The word line driver WLD is further coupled to a control circuit (not shown), and is configured to provide voltage signals or current signals on the word lines WL_L and on the word lines WL_R, in response to control signals generated by the control circuit. The word line driver WLD is coupled through the word lines WL_L to the array of memory cells 110, and is coupled through the word lines WL_R to the array of memory cells 120, for reading or writing corresponding memory cells in the array of memory cells 110 and/or 120.

In some embodiments, the provided signals on the word lines WL_L or WL_R have a voltage value that is substantially equal to a voltage difference between the supply voltage terminal VDD and the reference voltage terminal (hereinafter, for example, the ground). In various embodiments, each of the provided voltage signals on the word lines WL_L and on the word lines WL_R has a lower voltage value than the voltage difference between the supply voltage terminal VDD and the ground. Alternatively stated, the voltages of the word liens WL_L or WL_R provided by the word line driver WLD are lower than the voltages (i.e., difference between VDD and ground) provided by a power source (not shown). In another way to explain, the word line driver WLD is configured to implement suppressed voltages on the word lines WL_L and WL_R, for driving the memory cells by suppressed voltages. The word lines WL_L and WL_R with suppressed voltages are indicated as suppressed word lines, in some embodiments of the present disclosure.

Each of the array of memory cells 110 and the array of memory cells 120 includes memory cells MC arranged in rows and columns. For simplicity of illustration, only one memory cell MC in the array of memory cells 120 is labeled in FIG. 1. In some embodiments, the array of memory cells 110 is symmetrical to the array of memory cells 120 with respect to the word line driver WLD. In some embodiments, a number and an arrangement of the memory cells MC included in the array of memory cells 110 are the same as those included in the array of memory cells 120. For example, with reference to FIG. 1, the memory cells MC in each of the array of memory cells 110 and 120 are arranged in n+1 rows and m+1 columns. In some other embodiments, the array of memory cells 110 and the array of memory cells 120 are asymmetric, with respect to the word line driver WLD. The number of columns included in the array of memory cells 110 is different form that included in the array of memory cells 120.

The memory cells MC in the array of memory cells 110 are coupled to word lines WL_L0, WL_L1, . . . and WL_Ln and bit lines BL_L0, BL_L1, . . . , and BL_Lm. For simplicity, each of the word lines WL_L0, WL_L1, . . . , and WL_Ln is referenced as WL_L hereinafter for illustration, because the word lines WL_L0, WL_L1, . . . , and WL_Ln operate in a similar way in some embodiments. Similarly, each of the bit lines BL_L0, BL_L1, . . . , and BL_Lm is referenced as BL_L hereinafter for illustration. Similar to the memory cells MC in the array of memory cells 110, the memory cells MC in the array of memory cells 120 are coupled to word lines WL_R1, WL_R1, . . . and WL_Rn and bit lines BL_R0, BL_R1, . . . , and BL_Rm. For simplicity, each of the word lines WL_R0, WL_R1, . . . and WL_Rn is referenced as WL_R hereinafter for illustration, because word lines WL_R0, WL_R1, . . . and WL_Rn operate in a similar way in some embodiments. Similarly, each of the bit lines BL_R0, BL_R1, . . . , and BL_Rm is referenced as BL_R hereinafter for illustration.

The above numbers of word lines WL_L or WL_R, and bit lines BL_L or BL_R are given for illustrative purposes, and various numbers of the above word lines WL_L or WL_R and bit lines BL_L or BL_R are within the contemplated scope of the present disclosure.

Each of the memory cells MC in the array of memory cells 110 is coupled to one of the word lines WL_L and one of the bit lines BL_L in a corresponding row and a corresponding column. Furthermore, in the corresponding row, each of the memory cells MC in the array of memory cells 120 is coupled to one of the word lines WL_R in the same row and one of the bit lines BL_R. For example, in a top row shown in FIG. 1, the memory cells MC in the array of memory cells 110 are coupled to the word line WL_L0, and the memory cells MC in the array of memory cells 120 are coupled to the word line WL_R0. The word line WL_L0 and the word line WL_R0 are coupled through the word line driver WLD to each other, and are activated by the word line driver WLD. Alternatively stated, the word line driver WLD is configured to drive the memory cells in a corresponding row by selecting and charging the word lines WL_L and WL_R (i.e., the word lines WL_L0 and WL_R0 in this example) in this row.

In some embodiments, each of the memory cells MC in the array of memory cells 110 or 120 is implemented by an SRAM bit cell in a six-transistor (6T) configuration. Each of the memory cells MC includes a pair of cross-coupled inverters and a pair of accessing transistors. The pair of cross-coupled inverters are implemented by two transistors of one type (e.g., p-type metal oxide semiconductor transistors (PMOS transistor)) and two transistors of another type (e.g., n-type metal oxide semiconductor transistors (NMOS transistor)). The pair of accessing transistors are implemented by two transistors (e.g., two NMOS transistors). The pair of accessing transistors are selectively coupled to the bit lines BL_L or BL_R, and are driven by the word lines WL_L or WL_R. The configuration of the memory cells MC described above is given for illustrative purposes. Various configurations of the memory cells MC are within the contemplated scope of the present disclosure.

The configuration of the memory device 100 as illustrated above is given for illustrative purposes. Various configurations of the memory device 100 are within the contemplated scope of the present disclosure.

Figure 2:
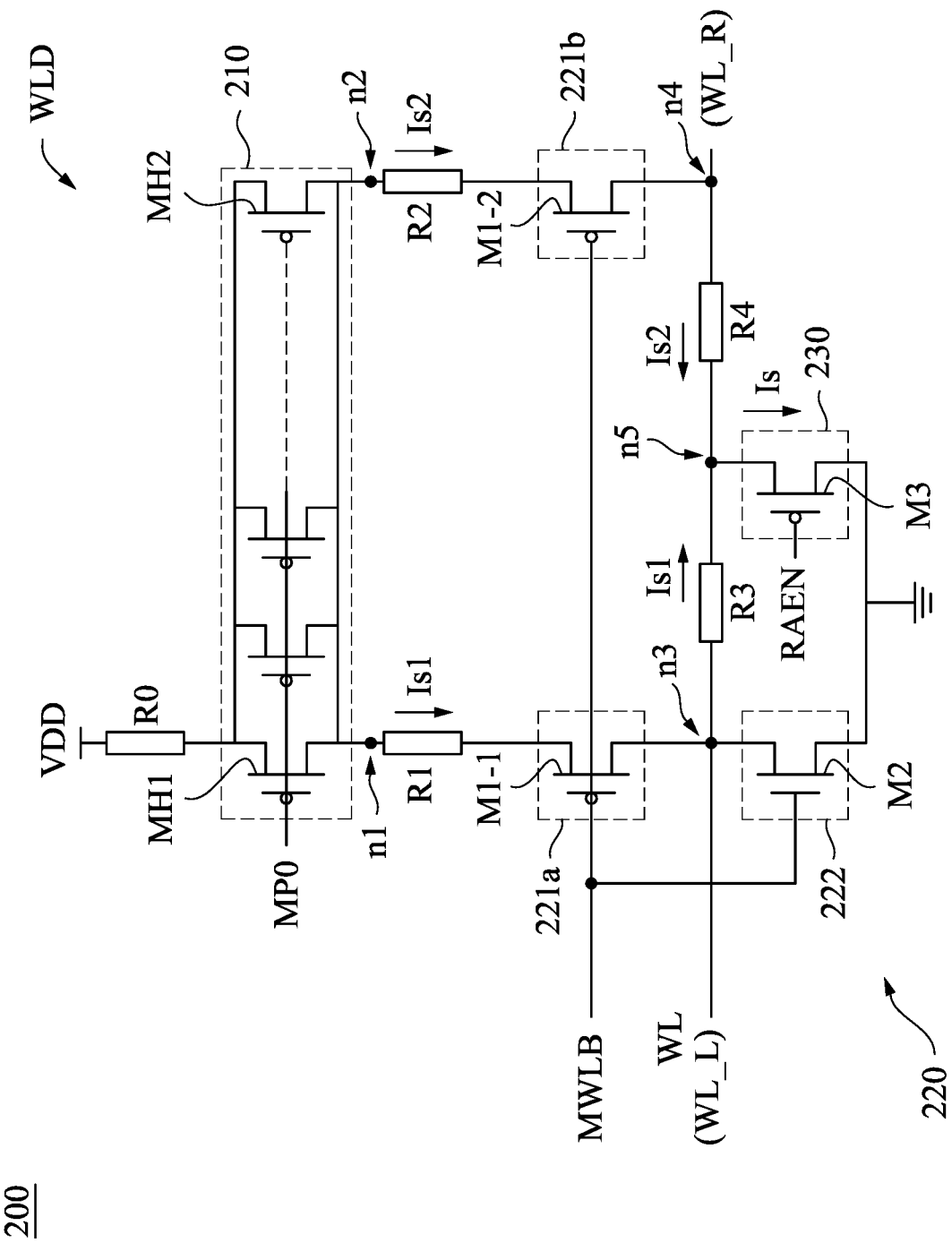
FIG. 2 is an equivalent circuit of a word line driver corresponding to the word line driver shown in FIG. 1, in accordance with some embodiments of the present disclosure.

Reference is made to FIG. 2. FIG. 2 is an equivalent circuit 200 of a word line driver WLD corresponding to the word line driver WLD shown in FIG. 1, in accordance with some embodiments of the present disclosure. The equivalent circuit 200 of the word line driver WLD is illustrated with resistors and the transistors to show the effective circuit connections. The word line driver WLD includes a header circuit 210, a driving circuitry 220 which includes driving circuits 221a, 221b, and 222, and a modulating circuit 230. In some embodiments, the transistors illustrated in the circuits 210, 221*a*, 221*b*, 222 or 230 are equivalent circuit thereof correspondingly. The resistive elements R0, R1, R2, R3, and R4 shown in FIG. 2 are parasitic resistances in the equivalent circuit 200, in some embodiments.

For illustration in FIG. 2, the word line driver WLD is coupled between the supply voltage terminal VDD and the reference voltage terminal (hereinafter, for example, the ground). The word line driver WLD is configured to output signals on a word line WL at two respective output terminals WL_L and WL_R, in response to control signals including, for example, a decoder signal MWLB. In some embodiments, the word line WL shown in FIG. 2 corresponds to, as shown in FIG. 1, one of the word lines WL_L0, WL_L1, . . . and WL_Ln and one of the word lines WL_R0, WL_R1, . . . and WL_Rn that are arranged in the same row where the word line WL_L is arranged. Alternatively stated, for one row in the memory device 100 shown in FIG. 1, the output terminals WL_L and WL_R are indicated as terminals to selectively charge the word line WL. The signal on the word line WL, output from the word line driver WLD at the output terminal WL_L, is coupled through the word line WL to some of the memory cells (e.g., the memory cells MC in the array of memory cells 110 shown in FIG. 1) in the same row. The signal on the word line WL, output from the word line driver WLD at the output terminal WL_R, is coupled through the word line WL to other some of the memory cells (e.g., the memory cells MC in the array of memory cells 120 shown in FIG. 1) in the same row.

The header circuit 210 is coupled through the resistive element R0 to the supply voltage terminal VDD, and is coupled through the resistive elements R1 and R2 to the driving circuits 221*a* and 211*b*, respectively. The driving circuit 221*a* is coupled to the driving circuit 221*b* in series and coupled to the driving circuit 222 in parallel. The driving circuit 221*a* is also coupled to the output terminal WL_L (i.e., the node n3), and further coupled through the resistive element R3 to the modulating circuit 230 at a node n5 on the word line WL. The driving circuit 221*b* is coupled to the output terminal WL_R (i.e., the node n4), and further coupled through the resistive element R4 to the modulating circuit 230 at the node n5. The driving circuit 222 is coupled between the output terminal WL_L (i.e., the node n3) and the ground. The modulating circuit 230 is coupled between the node n5 and the ground.

With reference to FIG. 2, in the equivalent circuit 200, the header circuit 210 includes transistors MH1, . . . , and MH2 which, in some embodiments, are PMOS transistors. A gate terminal of each of the transistors MH1, . . . , and MH2 are coupled together and are coupled to a control circuit (not shown), for receiving a control signal MP0 output from the control circuit. Source terminals of the transistors MH1, . . . , and MH2 are coupled to each other and are coupled through the resistive element R0 to the supply voltage terminal VDD. Drain terminals of the transistors MH1, . . . , and MH2 are coupled to each other and are coupled to through a node n1 to the driving circuit 221*a* and through a node n2 to the driving circuit 221*b*. Alternatively stated, a drain terminal of the transistor MH1 is coupled through the node n1 to the driving circuit 221*a*, and a drain terminal of the transistor MH2 is coupled to through the node n2 to the driving circuit 221*b*.

The driving circuit 221*a* includes a transistor M1-1 which, in some embodiments, is a PMOS transistor. The driving circuit 221*b* includes a transistor M1-2 which, in some embodiments, is a PMOS transistor. The driving circuit 222 includes a transistor M2 which, in some embodiments, is a NMOS transistor. A gate terminal of the transistor M1-1, a gate terminal of the transistor M1-2, and a gate terminal of the transistor M2 are coupled together and are further coupled to a word line decoder (not shown), for receiving the decoder signal MWLB output from the word line decoder. A source terminal of the transistor M1-1 is coupled through the resistive element R1 to the node n1, for receiving one of voltage/current signals output from the header circuit 210. A drain terminal of the transistor M1-1 is coupled to the node n3 which is also indicated as the output terminal WL_L, and is further coupled to a source terminal of the transistor M2. Also, the drain terminal of the transistor M1-1 is coupled through the resistive element R3 to the modulating circuit 230. A source terminal of the transistor M1-2 is coupled through the resistive element R2 to the node n2, for receiving one of voltage/current signals output from the header circuit 210. A drain terminal of the transistor M1-2 is coupled to the node n4 which is also indicated as the output terminal WL_L. Also, the drain terminal of the transistor M1-2 is coupled through the resistive element R4 to the modulating circuit 230. A source terminal of the transistor M2 is coupled to the node n3. A drain terminal of the transistor M2 is coupled to the ground. In some embodiments, the transistor M2 and at least one of the transistor M1-1 or the transistor M1-2 are configured to operate as an inverter.

The modulating circuit 230 includes a transistor M3 which, in some embodiments, is a PMOS transistor. A gate terminal of the transistor M3 is coupled to a control circuit (not shown), for receiving a control signal RAEN output from the control circuit. A source terminal of the transistor M3 is coupled to the node n5 on the word line WL, and a drain terminal of the transistor M3 is coupled to the ground.

The resistive element R0 is coupled between the supply voltage terminal VDD and the transistor MH1. The resistive element R1 is coupled between the node n1 and the transistor M1-1. The resistive element R2 is coupled between the node n2 and the transistor M1-2. The resistive element R3 is coupled between the node n3 and the node n5. The resistive element R4 is coupled between the node n3 and the node n5. The resistive element R3 and the resistive element R4 are coupled in series on the word line.

In some embodiments, at least one of the resistive elements R0-R4 is referred to as an internal resistance which is included in the word line driver WLD including, for example, the transistors MH1, MH2, M1-1, M1-2, M2 and M3 or conductive wires coupled between thereof. In some other embodiments, at least one of the resistive elements R0-R4 is referred to as a parasitic resistance of the routings which is included in the word line driver WLD. The parasitic resistance is also indicated as an internal resistance hereinafter, in some embodiments. Alternatively stated, at least one of the resistive elements R0-R4 is referred to as an equivalent resistance. For example, with reference to FIG. 2, in some embodiments, the resistive element R3 is the equivalent resistance of a portion of the word line WL that includes the output terminal WL_L, and the resistive element R4 is the equivalent resistance of another portion of the word line WL that includes the output terminal WL_R. In various embodiments, at least one of the resistive elements R0-R4 is referred to as a physical resistor which is included in the word line driver WLD, and has corresponding electrical connection or configuration as shown in FIG. 2.

With continued reference to FIG. 2, in some embodiments, the resistive element R0 is an equivalent internal resistance of the header circuit 210. The resistive element R0 includes at least one of the internal resistances of the transistors MH1 and MH2, or conductive wires coupled in, including, for example, between the transistor MH1 and the transistor MH2, or between the transistor MH1 and the supply voltage node VDD. In some other embodiments, the resistive element R0 is the internal resistance of the conductive wires coupled in between the transistor MH1 and the supply voltage node VDD. Furthermore, the resistive element R1 is an equivalent internal resistance of the driving circuit 221a. The resistive element R1 includes the internal resistances of the transistor M1-1, and conductive wires coupled in, including, for example, between the transistor M1-1 and the node n1. Similarly, the resistive element R2 is an equivalent internal resistance of the driving circuit 221b. The resistive element R2 includes the internal resistances of the transistor M1-2, and conductive wires coupled in, including, for example, between the transistor M1-2 and the node n2. In some embodiments, the resistive element R1 is the internal resistance of the conductive wires coupled in between transistor MH1 and the node n1, and the resistive element R2 is the internal resistance of the conductive wires coupled in between the transistor M1-2 and the node n2.

Moreover, at least one of the resistive elements R3 or R4 is an equivalent internal resistance of the modulating circuit 230. At least one of the resistive elements R3 or R4 includes the internal resistances of the transistor M3. The resistive element R3 includes an equivalent internal resistance of conductive wires coupled in, including, for example, between the transistor M3 and the node n3. Alternatively stated, an internal resistance of conductive wires coupled between the driving circuit 221a and the modulating circuit 230 is included in the resistive element R3. Similarly, the resistive element R4 includes an equivalent internal resistance of conductive wires coupled in, including, for example, between the transistor M3 and the node n4. Alternatively stated, an internal resistance of conductive wires coupled between the driving circuit 221b and the modulating circuit 230 is included in the resistive element R4. In various embodiments, the resistive element R3 is the internal resistance of the conductive wires coupled in between the transistor M3 and the node n3, and the resistive element R4 is the internal resistance of the conductive wires coupled in between the transistor M3 and the node n4.

The above implementation of the equivalent circuit 200 is provided for illustrative purposes. Various implementations of the equivalent circuit 200 are within the contemplated scope of the present disclosure. For example, in some embodiments, the equivalent circuit 200 further includes a control circuit for generating the control signals MP0 and RAEN. In various embodiments, the equivalent circuit 200 further includes a word line decoder for generating the decoder signal MWLB. In alternative embodiments, the transistors MH1, MH2, M1-1, M1-2 and M2 are configured to operate as switches.

Figure 3:
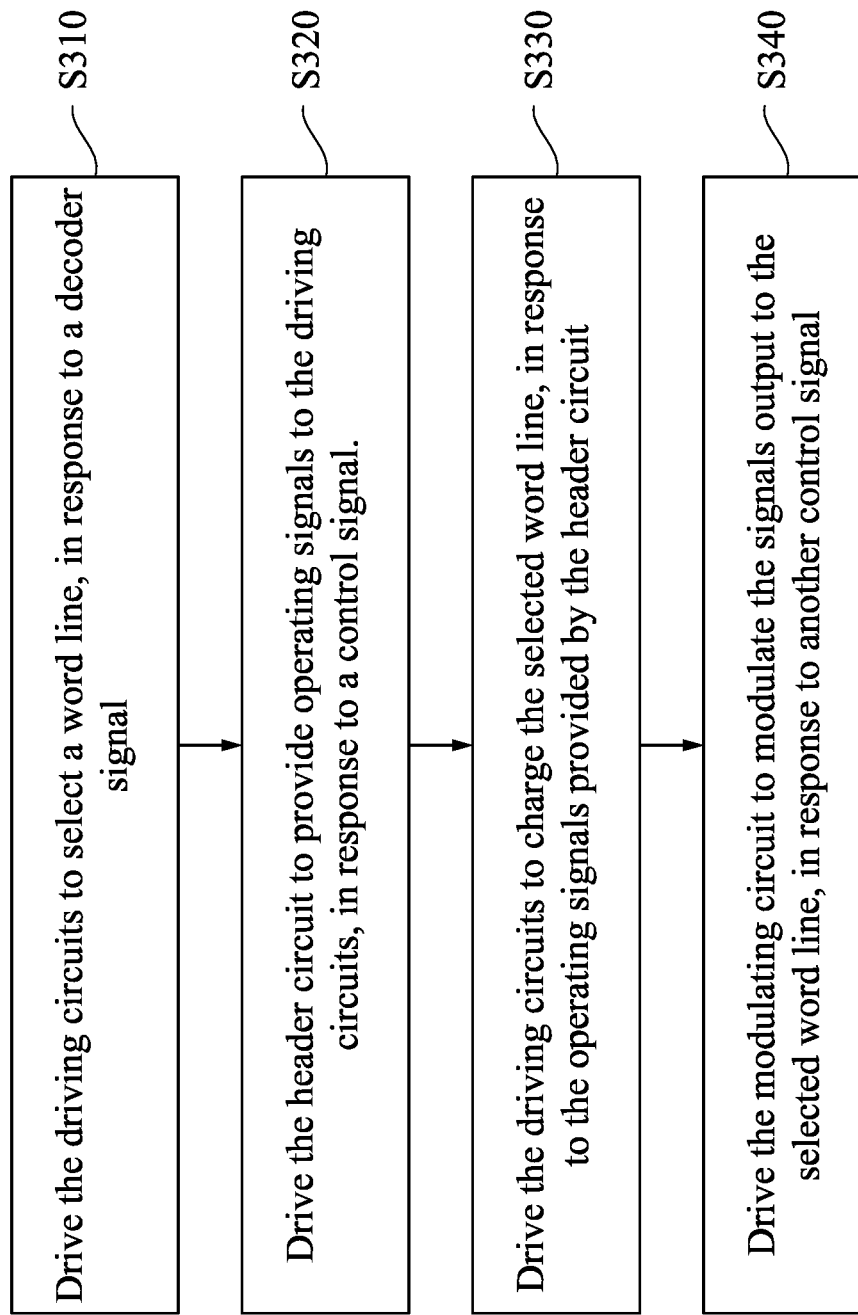
FIG. 3 is a flow chart of a method for operating a word line driver corresponding to the word line driver shown in FIG. 2, in accordance with some embodiments of the present disclosure.

Reference is made to FIG. 3. FIG. 3 is a flow chart of a method 300 for operating a word line driver corresponding to the word line driver WLD shown in FIG. 2, in accordance with some embodiments of the present disclosure. Following illustrations of the method 300 in FIG. 3 with reference to the word line driver WLD in FIG. 2 include exemplary operations. However, the operations in FIG. 3 are not necessarily performed in the order shown. Alternatively stated, operations may be added, replaced, changed order, and/or eliminated as appropriate, in accordance with the spirit and scope of various embodiments of the present disclosure.

In operation S310, the driving circuits are driven to select a word line, in response to a decoder signal. For illustration, as shown in FIG. 2, the driving circuits 221a, 211b, and 222 are driven to select the word line WL, in response to the decoder signal MWLB. Specifically, the transistor M1-1 of the driving circuits 221a and the transistor M1-2 of the driving circuits 221b are turned on, in response to the decoder signal MWLB. At the same time, since the transistor M2 is a NMOS transistor different from the transistors M1-1 and M1-2, the transistor M2 is turned off, in response to the decoder signal MWLB. With the above operations, the word line WL coupled with the turn-on transistors M1-1 and M1-2 is indicated as the selected word line WL.

In some embodiments, the driving circuits 221a and 221b are referred to as two separated pull-up circuits. Alternatively stated, the transistors M1-1 and M1-2 are operated as pull-up transistors, configured to charge the word line WL to a high voltage compared to the ground. In some embodiments, the driving circuit 222 is referred to as a pull-down circuit. Alternatively stated, the transistor M2 is performed as pull-down transistors, configured to couple the word line WL to the ground.

In operation S320, the header circuit is driven to provide operating signals to the driving circuits, in response to a control signal. Alternatively stated, at least one transistor, which is operated as a switch, included in the header circuit is driven by the control signal, for coupling the operating signals from a power supply to the driving circuits. For illustration, as shown in FIG. 2, the header circuit 210 is driven to provide signals (e.g., current signals Is1 and Is2 or voltage signals which are not shown) to the driving circuits 221a and 221b, in response to the control signal MP0. Specifically, the transistors MH1 and MH2 of the header circuit 210 are turned on, in response to the decoder signal MP0, and the signals are coupled from the supply voltage terminal VDD through the transistors MH1 and MH2 of the header circuit 210 to the nodes n1 and n2, respectively. Since the node n1 is further coupled to the transistor M1-1 of the driving circuit 221a, and the node n2 is further coupled to the transistor M1-2 of the driving circuit 221b, the signals are further coupled to the driving circuits 221a and 221b respectively.

In some embodiments, with reference back to FIG. 2, a current signal Is1 is transmitted from the node n1 through the resistive element R1 to the transistor M1-1, and a current signal Is2 is transmitted from the node n2 through the resistive element R2 to the transistor M1-2. In some other embodiments, the transistors MH1, MH2, M1-1, M1-2 and M2 included in the word line driver WLD are ideal transistors which are operated as switches, and internal resistances (also referred to as equivalent resistances) thereof are indicated as corresponding resistive elements R0-R4. In various embodiments, the resistive element R1 is the internal resistance of the transistor M1-1, and the resistive element R2 is the internal resistance of the transistor M1-2. Furthermore, the transistor M1-1 is identical to the transistor M1-2. Therefore, the resistive element R1 is substantially identical to the resistive element R2. Accordingly, the current signal Is1 is substantially equal to the current signal Is2. Alternatively stated, the voltage signal (not shown) input to the transistor M1-1 is substantially equal to the voltage signal (not shown) input to the transistor M1-2. In alternative embodiments, the resistive element R1 includes the internal resistance of the transistor M1-1 and routings between the node n1 and the transistor M1-1. The resistive element R2 includes the internal resistance of the transistor M1-2 and routings between the node n2 and the transistor M1-2. The current signal Is1 is substantially equal to the current signal Is2 because of the resistive element R1 being the same as the resistive element R2.

In operation S330, the driving circuits are driven to charge the selected word line, in response to the operating signals provided by the header circuit. Alternatively stated, the selected word line is charged by the driving circuits, utilizing the turn-on driving circuits to couple the operating signals to the selected word line. For illustration, as shown in FIG. 2, the driving circuits 221a and 221b are activated to charge the selected word line WL by coupling the voltage signals output from the header circuit 210 to the selected word line WL. Specifically, since the transistors M1-1 and M1-2 are turned on, which are operated as two respective switches, the signals are coupled from the nodes n1 and n2 to the nodes n3 and n4, respectively. Furthermore, the nodes n3 and n4 are indicated as output terminals WL_L and WL_R of the word line driver WLD, and are also referred to as input terminals of the selected word line WL. With the above operations, the selected word line WL is charged at two respective nodes n3 (i.e., node WL_L) and n4 (i.e., node WL_R) by the transistors M1-1 of the driving circuit 221a and M1-2 of the driving circuit 221b, respectively.

In some embodiments, as discussed above with reference to FIG. 2 and the operation S320 of FIG. 3, since the current signal Is1 is substantially equal to the current signal Is2 and no other passive components coupled between the transistor M1-1 and the node n3 or between the transistor M1-2 and the node n4, the current signals Is1 and Is2 provided to the nodes n3 and n4 are the same as one another. Alternatively stated, two respective nodes n3 (i.e., node WL_L) and n4 (i.e., node WL_R) of the selected word line WL are charged by the same current signal Is1 or Is2.

In operation S340, the modulating circuit is driven to modulate the signals output to the selected word line, in response to another control signal. Alternatively stated, voltages or currents of the selected word line is modified by the modulating circuit, utilizing the activated modulating circuits to couple the signals at the selected word line to a lower voltage terminal (e.g., the ground). For illustration, as shown in FIG. 2, the modulating circuit 230 is driven to modulate the signals output to the selected word line WL, in response to the control signal REAN. Specifically, the transistor M3 of the modulating circuit 230 is turned on, in response to the control signal REAN, and the current signal Is1 is transmitted from the node n3 through the resistive element R3 to the node n5, and the current signal Is2 is transmitted from the node n4 through the resistive element R4 to the node n5. Subsequently, the current signals Is1 and Is2 are coupled together as a current signal Is. The signal Is at the selected word line WL is transmitted from the node n5 through the transistor M3 of the modulating circuit 230 to the ground. With the above operations, the voltages or currents of the selected word line WL, which are final output signals on the selected word line WL, are lower than that of the power supply (e.g., the supply voltage VDD). Accordingly, the suppressed word line is implemented, and the suppressed voltages at the selected word line WL are provided to the memory cells, for driving these memory cells with lower voltages or currents.

In some embodiments, as discussed above with reference to FIG. 2 and the operations S320 and S330 of FIG. 3, the current signal Is1 is substantially equal to the current signal Is2. Furthermore, in some embodiments, the resistive element R3 includes the internal resistance of the transistor M3 and routings between the node n3 and the node n5. The resistive element R4 includes the internal resistance of the transistor M3 and routings between the node n4 and the node n5. In some other embodiments, the routings between the driving circuit 221a and the modulating circuit 230 are substantially identical to the routings between the driving circuit 221b and the modulating circuit 230. Since then, the resistive element R3 is substantially identical to the resistive element R4. Therefore, a voltage difference between the node n3 and n5 is substantially equal to a voltage difference between the node n4 and n5. Accordingly, the signals output at the nodes n3 and n4 on the selected word line WL are equal to each other.

In some approaches, only two driving circuits corresponding to, for example, the driving circuits 221a and 221b of FIG. 2, are included in a word line driver and are configured to charge a selected word line at one of two output terminals. However, the two output terminals correspond to two internal resistances of the selected word line, and thus voltage signals outputted through the two output terminals are different from each other when the selected word line is charged, which results in unbalanced voltage levels on the selected word line, causing IR-drop issue and mis-match speeds of read/write operations, etc.

Compared to the above approaches, in the embodiments of the present disclosure, for example with reference to FIGS. 2 and 3, the driving circuit indicated as the pull-up circuit is split into two driving circuits 221a and 221b, and the driving circuits 221a and 221b are coupled to two separated output terminals WL_L and WL_R. As a total resistance of one portion of the word line driver WLD, including, for example, the resistive element R1, the transistor M1-1 and the resistive element R3, is substantially equal to a total resistance of the other portion of the word line driver WLD, including, for example, the resistive element R2, the transistor M1-2 and the resistive element R4, voltage differences between those are substantially the same as each other. Alternatively stated, no voltage difference exists between respective output terminals WL_L and WL_R. Accordingly, the selected word line WL has balanced voltage level, and this improves the read/write operation speed and IR-drop issue and mis-match speeds of read/write operations, etc., can be avoided.

Figure 4:
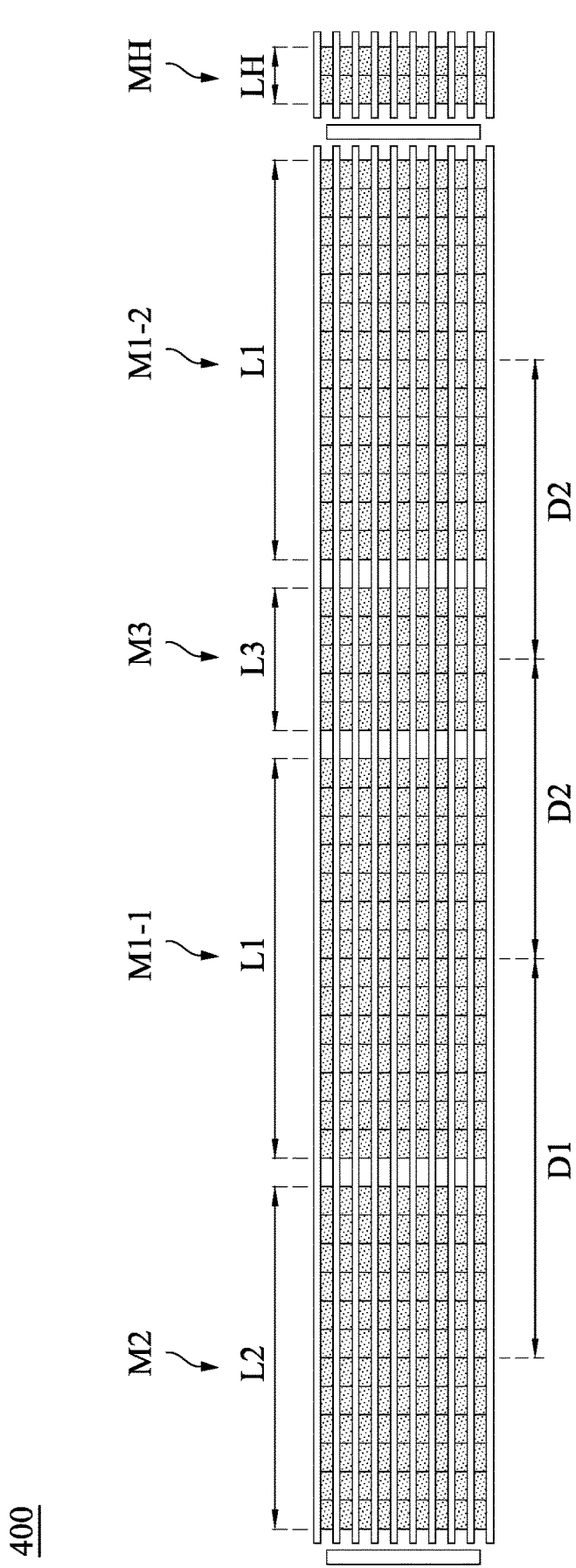
FIG. 4 is a layout diagram of a word line driver corresponding to the word line driver shown in FIG. 2, in accordance with some embodiments of the present disclosure.

Reference is made to FIG. 4. FIG. 4 is a layout diagram 400 of a word line driver corresponding to the word line driver WLD shown in FIG. 2, in accordance with some embodiments of the present disclosure.

For illustration in FIG. 4, the layout structure of the transistor M1-1 is disposed next to the layout structure of the transistor M2. Also, the layout structure of the transistor M1-1 is disposed between the layout structure of the transistor M2 and the layout structure of the transistor M3. The layout structure of the transistor M3 is disposed between the layout structure of the transistor M1-1 and the layout structure of the transistor M1-2. Alternatively stated, the layout structure of the modulating circuit 230 is disposed between the layout structure of the driving circuit 221a and the layout structure of the driving circuit 221b, in a layout view. In addition, the layout structure of the transistor MH is separate from at least one of the layout structures of the transistors M2, M1-1, M3, or M1-2. In some embodiments, the layout structure of the transistor MH shown in FIG. 4 corresponds to an equivalent circuit of the transistors MH1, . . . , and MH2 included in the header circuit 210.

In some embodiments, at least one of the layout structures of the transistors M2, M1-1, M3, M1-2 or MH has an area in the layout diagram 400 that is different from the others. The areas of the layout structures are referred to as areas in the layout diagram 400 for forming the transistors including, for example, the transistors M2, M1-1, M3, M1-2 and MH. The area of a layout structure/design is associated with a driving ability of the corresponding transistor. For example, as illustrated in FIG. 4, the layout structures of the transistors M2, M1-1, M3, M1-2 and MH have widths that are the same as one another, and at least one of the layout structures of the transistors M2, M1-1, M3, M1-2 or MH has a length that is different from the others. Specifically, for the layout structures of the transistors shown in FIG. 4, the transistor M2 has a length L2; the transistor M1-1 has a length L1; the transistor M3 has a length L3; the transistor M1-2 has a length L1; and the transistor MH has a length LH. Accordingly, at least one of the transistors M2, M1-1, M3, M1-2 or MH has a driving ability that is different from the others. In some embodiments, the area of the layout design has a positive correlation with the driving ability. For example, as the area of the layout design is greater, the driving ability of the corresponding transistor is greater.

In some embodiments, the length L1 is substantially equal to the length L2, and the area of the transistor M1-1 or M1-2 is substantially same as the transistor M2. In some other embodiments, the length L1 is larger than the length L3, and the area of the transistor M1-1 or M1-2 is greater than the transistor M3. In various embodiments, the length L1 is larger than the length LH, and the area of the transistor M1-1 or M1-2 is greater than the transistor MH.

In some embodiments, the layout structures of the transistor M1-1 and the transistor M1-2 have the same area in the layout diagram 400, for forming two identical transistors M1-1 and M1-2.

With continued references to FIG. 4, the layout structures of the transistors M2, M1-1, M3, M1-2 and MH are separated from each other by at least one distance. In some embodiments, the distance between the layout structures is associated with the routing lengths in the word line driver WLD. In some other embodiment, the routing lengths in the word line driver WLD is further correlated with the driving ability of the corresponding transistors M2, M1-1, M3, M1-2 and MH. A distance D1 is distanced from a middle of the layout structure of the transistor M2 (i.e., at half of the length L2 of the transistor M2) to a middle of the layout structure of the transistor M1-1 (i.e., at half of the length L1 of the transistor M1-1). A distance D2 is distanced from a middle of the layout structure of the transistor M1-1 (i.e., at half of the length L1 of the transistor M1-1) to a middle of the layout structure of the transistor M3 (i.e., at half of the length L3 of the transistor M3). Furthermore, the distance from a middle of the layout structure of the transistor M3 (i.e., at half of the length L3 of the transistor M3) to a middle of the layout structure of the transistor M1-2 (i.e., at half of the length L1 of the transistor M1-2) is also indicated as the distance D2. Alternatively stated, the layout structure of the transistor M3 is disposed in the middle of the layout structures of the two separated transistors M1-1 and M1-2.

In some embodiments, the distance D1 or D2 shown in FIG. 4 is indicated as a routing length of the conductive rails (not shown) disposed in multiple metal layers, for example, M0-M3 layers. The conductive rails in the layout diagram 400 correspond to the conductive wires coupled between the corresponding transistors. Since the conductive rails are made of metal, lengths of the conductive rails have positive correlation with the resistances of the conductive rails. In some embodiments, with reference to FIG. 4, a conductive rail coupled between the transistor M1-1 and the transistor M3 has a length which is substantially equal to the distance D2. Similarly, a conductive rail coupled between the transistor M1-2 and the transistor M3 has a length which is also substantially equal to the distance D2. Therefore, the conductive rail between the transistors M1-1 and M3 is substantially identical to the conductive rail between the transistors M1-2 and M3. Accordingly, the internal resistance (i.e., the resistive element R3) of the conductive wires coupled between the transistors M1-1 and M3 is equal to the internal resistance (i.e., the resistive element R4) of the conductive wires coupled between the transistors M1-2 and M3.

In some embodiments, the transistor M3, the conductive rails coupled between the transistor M3 and the transistor M1-1, and the conductive rails coupled between the transistor M3 and the transistor M1-2 are symmetrical at a middle of the transistor M3 in the layout diagram 400. In some other embodiments, the transistor M1-2 and the conductive rails coupled between the transistor M1-2 and the transistor M3 are formed in the layout diagram 400 by mirroring the transistor M1-1 and the conductive rails that are coupled between the transistor M1-1 and the transistor M3, with respect to a middle of the transistor M3. Alternatively stated, the transistors M1-1 and M1-2 are mirrored by each other, with respect to the transistor M3. In another way to explain, the transistor M3 is placed at the center of the transistors M1-1 and M1-2.

The configuration and arrangement of the layout diagram 400 shown in FIG. 4 is given for illustrative purposes. Various configurations and arrangements of the layout diagram 400 to implement the word line driver WLD in FIG. 2 are within the contemplated scope of the present disclosure. For example, in some embodiments, the transistor MH is arranged adjacent to the transistor M2 in a layout view.

Figure 5:
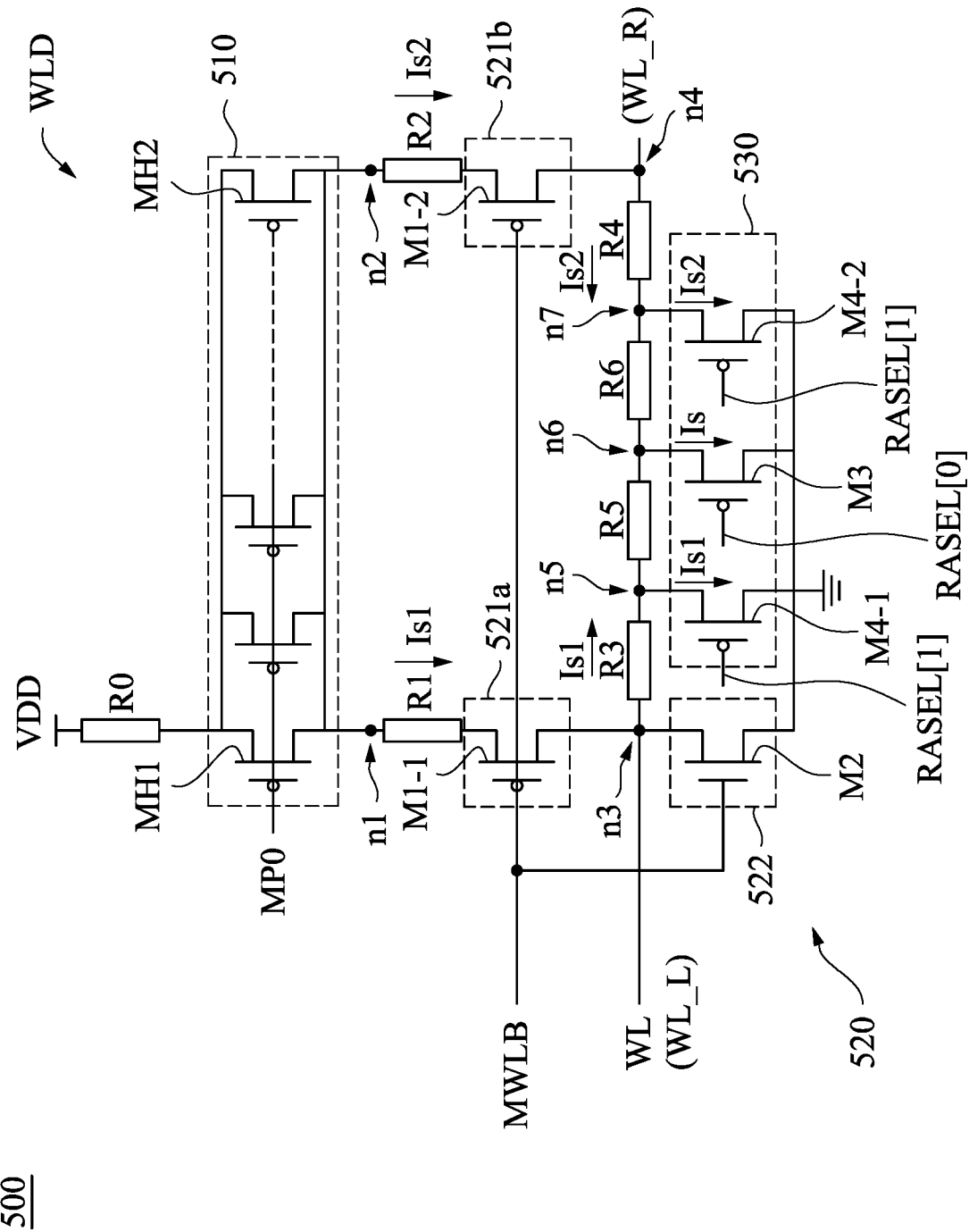
FIG. 5 is an equivalent circuit of a word line driver corresponding to the word line driver shown in FIG. 1, in accordance with some embodiments of the present disclosure.

Reference is made to FIG. 5. FIG. 5 is an equivalent circuit 500 of a word line driver WLD corresponding to the word line driver WLD shown in FIG. 1, in accordance with some embodiments of the present disclosure. The word line driver WLD includes a header circuit 510, a driving circuitry 520 which includes driving circuits 521a, 521b, and 522, and a modulating circuit 530.

In some embodiments, the word line driver WLD shown in FIG. 5 is an alternative embodiment of the word line driver WLD shown in FIG. 2. The header circuit 510 and the driving circuits 521a, 521b, and 522 correspond to the header circuit 210 and the driving circuits 221a, 221b, and 222 shown in FIG. 2, respectively. Configurations and/or relationships between the header circuit 510, the driving circuits 521a, 521b, and 522 and the modulating circuit 530 in the embodiments of FIG. 5 are similar to the embodiments of FIG. 2 as discussed above. Thus, they are not further detailed herein. The word line driver WLD with respect to the embodiments of FIG. 2, like elements in FIG. 5 are designated with the same reference numbers for ease of understanding.

Compared to the embodiments illustrated in FIG. 2, the word line driver WLD further includes resistive elements R5 and R6 on the word line WL. All of the resistive elements R3, R4, R5 and R6 are on the word line WL, and are coupled between two separated output terminals WL_L and WL_R of the word line WL. In some other embodiments, with reference to FIG. 5, the resistive element R3 is the internal resistance of the word line WL coupled in between the nodes n3 and n5. The resistive element R5 is the internal resistance of the word line WL coupled in between the nodes n5 and n6. The resistive element R6 is the internal resistance of the word line WL coupled in between the nodes n6 and n7. The resistive element R4 is the internal resistance of the word line WL coupled in between the nodes n7 and n4.

Furthermore, the modulating circuit 530 further includes transistors M4-1 and M4-2 which, in some embodiments, are PMOS transistors. The transistors M4-1, M3, and M4-2 are coupled in parallel, and coupled to the selected word line WL at nodes n5, n6 and n7 respectively. A gate terminal of each of the transistors M4-1 and M4-2 is coupled to a control circuit (not shown), for receiving a control signal RASEL[1] having a logic value indicated as "1" output from the control circuit. A source terminal of the transistor M4-1 is coupled to the node n5, and a drain terminal of the transistor M4-1 is coupled to the ground. A source terminal of the transistor M4-2 is coupled to the node n7, and a drain terminal of the transistor M4-2 is coupled to the ground. A gate terminal of the transistor M3 is coupled to the control circuit, for receiving the same control signal RASEL[0] having a logic value indicated as "0" output from the control circuit. A source terminal of the transistor M3 is coupled to a node n6, and a drain terminal of the transistor M3 is coupled to the ground.

In some embodiments, the logic value indicated as "1" is referred to as a logic high, and the logic value indicated as "0" is referred to as a logic low. In various embodiments, the control signal RASEL[1] is configured to turn on the transistors M4-1 and M4-2, and to turn off the transistor M3. Similarly, the control signal RASEL[0] is configured to turn off the transistors M4-1 and M4-2, and to turn on the transistor M3.

In some embodiments, a method for operating the word line driver WLD shown in FIG. 5 is similar to the embodiments of FIG. 3 as discussed above.

For illustration with the operation S310 shown in FIG. 3, similar to the operation S310 with reference to FIG. 2, with reference to FIG. 5, the transistor M1-1 and the transistor M1-2 of the respective driving circuits 521a and 521b are turned on, in response to the decoder signal MWLB, and the word line WL coupled with turn-on transistors M1-1 and M1-2 is indicated as the selected word line WL.

For illustration in the operation S320 shown in FIG. 3, similar to the operation S320 with reference to FIG. 2, with reference to FIG. 5, the transistors MH1 and MH2 of the header circuit 510 are turned on, in response to the decoder signal MP0. The signal (e.g., the current signal Is1) is coupled from the supply voltage terminal VDD through the transistor MH1 to the node n1, and further coupled through the resistive element R1 to the transistor M1-1 of the driving circuit 521a. At the same time, the signal (e.g., the current signal Is2) is coupled from the supply voltage terminal VDD through the transistor MH2 to the node n2, and further coupled through the resistive element R2 to the transistor M1-2 of the driving circuit 521b.

For illustration in the operation S330 shown in FIG. 3, similar to the operation S330 with reference to FIG. 2, with reference to FIG. 5, the signal Is1 is transmitted through the transistor M1-1 to the node n3 which is indicated as one of the output terminals of the word line driver WLD. Also, the signal Is2 is transmitted through the transistor M1-2 to the node n4 which is indicated as the other one of the output terminals of the word line driver WLD. Subsequently, the selected word line WL is charged at two respective nodes n3 (i.e., node WL_L) and n4 (i.e., node WL_R) by the transistors M1-1 of the driving circuit 521a and the transistors M1-2 of the driving circuit 521b.

For illustration in the operation S340 shown in FIG. 3, with reference to FIG. 5, the transistor M3 is turned off and the transistors M4-1 and M4-2 are turned on, in response to the control signal RASEL[1]. The current signal Is1 is transmitted from the node n3 through the resistive element R3 to the node n5. Meanwhile, the current signal Is2 is transmitted from the node n4 through the resistive element R4 to the node n7. Subsequently, the current signal Is1 is transmitted from the node n5 through the transistor M4-1 to the ground. At the same time, the current signal Is2 is transmitted from the node n7 through the transistor M4-2 to the ground. With the above operations, the selected word line WL is provided with a lower voltage (which is indicated as a first voltage and not shown) at two respective output terminals WL_L and WL_R. Accordingly, the suppressed word line WL is provided to the memory cells, for driving these memory cells with lower voltages or currents.

Furthermore, with reference to FIG. 5, in some embodiments, the transistor M3 is turned on and the transistors M4-1 and M4-2 are turned off, in response to the control signal RASEL[0]. The current signal Is1 is transmitted from the node n3 through the resistive element R3 to the node n5, and further coupled through the resistive element R5 to the node n6. Meanwhile, the current signal Is2 is transmitted from the node n4 through the resistive element R4 to the node n7, and further coupled through the resistive element R6 to the node n6. Subsequently, the current signals Is1 and Is2 are transmitted from the node n5 together as the current signal Is at the node n6, and the current signal Is is transmitted through the transistor M3 to the ground. Therefore, similar to the embodiments that is driven by the control signal RASEL[1] as discussed above, two respective output terminals WL_L and WL_R of the selected word line WL are modulated to having a lower voltage or current value. Accordingly, the suppressed word line WL is provided with a second voltage at two respective output terminals WL_L and WL_R. The second voltage is different from the first voltage implemented by the embodiments driven by the control signal RASEL[1].

In some embodiments, the control signal RASEL having the logic value 0 or 1 is determined at the back-end fabrication of the memory device, corresponding to, for example, the memory device of FIG. 1, by the developer. In some other embodiments, the modulating circuit 530 is configured to modulate the signals output from the word line driver WLD with one of various voltage or current values. Since the transistor M3 may have a different driving ability compared to each of the transistors M4-1 and M4-2, the second voltage on the selected word line driven by the control signal RASEL[0] is different from the first voltage on the selected word line driven by the control signal RASEL[1]. In various embodiments, the operation of selecting/determining the control signals RASEL[0] or RASEL[1] to drive the modulating circuit 530, is referred to as an extra margin adjustment (EMA) for the memory device.

Figure 6:
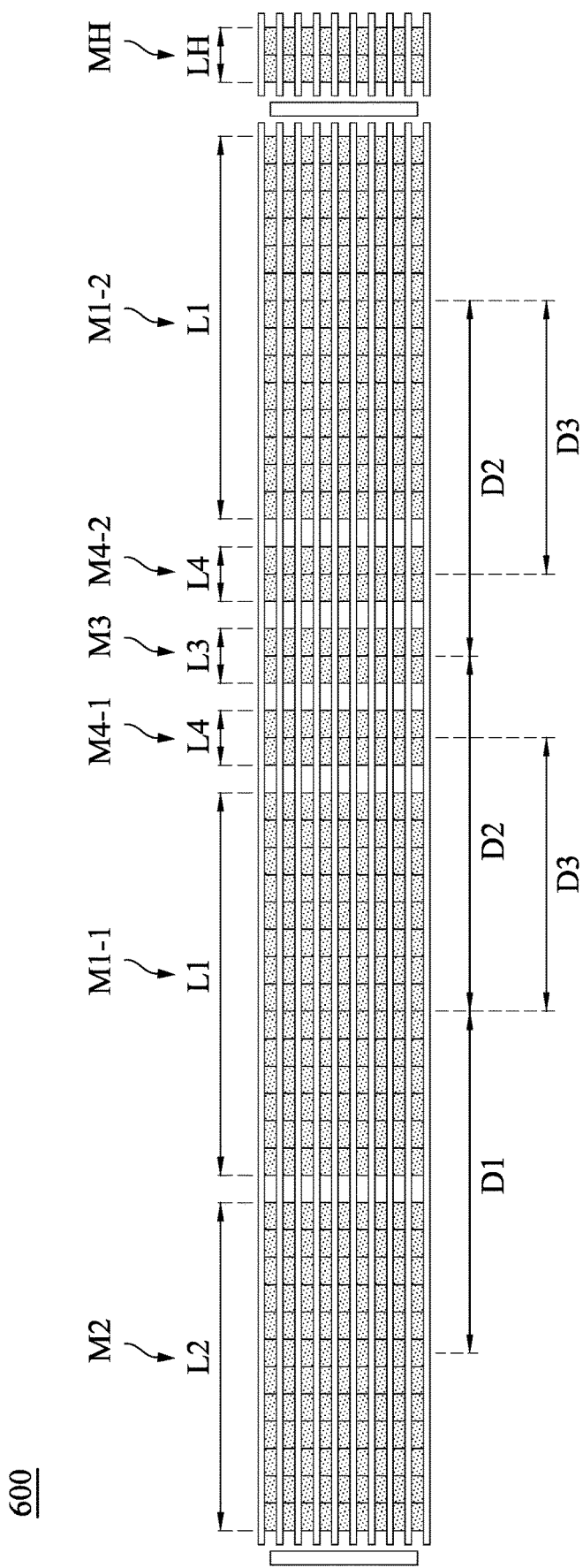
FIG. 6 is a layout diagram of a word line driver corresponding to the word line driver shown in FIG. 5, in accordance with some embodiments of the present disclosure.

Reference is made to FIG. 6. FIG. 6 is a layout diagram 600 of a word line driver corresponding to the word line driver WLD shown in FIG. 5, in accordance with some embodiments of the present disclosure.

For illustration in FIG. 6, the layout structure of the transistor M2 is disposed next to the layout structure of the transistor M1-1. The layout structure of the transistor M1-1 is disposed between the layout structures of the transistor M2 and the transistor M4-1. The layout structure of the transistor M4-1 is disposed between the layout structures of the transistor M1-1 and the transistor M3. The layout structure of the transistor M3 is disposed between the layout structures of the transistor M4-1 and the transistor M4-2. The layout structure of the transistor M4-2 is disposed between the layout structures of the transistor M3 and the transistor M1-2. The layout structure of the transistor M1-2 is disposed between the layout structures of the transistor M4-2 and the transistor MH. Alternatively stated, the modulating circuit, including the transistors M3, M4-1 and M4-2, is disposed between two separated driving circuits including the transistors M1-1 and M1-2, in a layout view.

In some embodiments, the transistors M2, M1-1, M4-1, M3, M4-2, M1-2 and MH have different driving abilities for implementing the corresponding operations discussed above with reference to FIGS. 3 and 5. For example, with reference to FIG. 6, the layout structure of the transistor M2 has a length L2; the layout structure of the transistor M1-1 or M1-2 has a length L1; the layout structure of the transistor M4-1 or M4-2 has a length L4; the layout structure of the transistor M3 has a length L3; and the layout structure of the transistor MH has a length LH. In some embodiments, the length L1 is greater than each of the length LH, L3 and L4.

In some embodiments, at least two of the transistors M2, M1-1, M4-1, M3, M4-2, M1-2 and MH have same driving abilities for operating identically. For example, with reference to FIG. 6, the layout structures of the transistors M1-1 and M1-2 have the same length L1, and the layout structures of the transistors M4-1 and M4-2 have the same length L4. Therefore, the transistor M1-1 is identical to the transistor M1-2, and the transistor M4-1 is identical to the transistor M4-2. Accordingly, the internal resistance (i.e., the resistive element R1) of the transistor M1-1 is equal to the same (i.e., the resistive element R2) of the transistor M1-2. Also, the internal resistance (i.e., the resistive element R3) of the transistor M4-1 is equal to the same (i.e., the resistive element R4) of the transistor M4-2. In alternative embodiments, the length L2 is as same as the length L1, or the length L4 is as same as the length L3.

In some embodiments, the layout structures of the transistors M2, M1-1, M4-1, M3, M4-2, M1-2 and MH are separated from each other by different distances, for forming corresponding conductive rails in several metal layers with different routing lengths. For example, for the layout structures of the transistors shown in FIG. 6, a middle of the transistor M2 (i.e., at half of the length L2 of the transistor M2) is separated from a middle of the transistor M1-1 (i.e., at half of the length L1 of the transistor M1-1) by a distance D1. A middle of the transistor M1-1 (i.e., at half of the length L1 of the transistor M1-1) is separated from a middle of the transistor M3 (i.e., at half of the length L3 of the transistor M3) by a distance D2 that is different from the distance D1.

In some embodiments, at least one of the layout structure of the transistors shown in FIG. 4, the transistors M2, M1-1, M4-1, M3, M4-2, M1-2 or MH are separated from each other by a same distance, for forming corresponding conductive rails with the same routing length. For example, for the layout structures of the transistors shown in FIG. 6, a middle of the transistor M1-2 (i.e., at half of the length L1 of the transistor M1-2) is separated from a middle of the transistor M3 (i.e., at half of the length L3 of the transistor M3) by the distance D2. Therefore, a conductive rail coupled between the transistor M1-1 and the transistor M3 has a length which is the same as a length of a conductive rail coupled between the transistor M1-2 and the transistor M3, and is substantially equal to the distance D2. Accordingly, the internal resistances, including the resistive elements R3 and R5, of the conductive wires coupled between the transistors M1-1 and M3 is equal to the internal resistances, including the resistive elements R4 and R6, of the conductive wires coupled between the transistors M1-2 and M3.

Furthermore, with reference to FIG. 6, for the layout structures of the transistors shown in FIG. 6, a middle of the transistor M1-1 (i.e., at half of the length L1 of the transistor M1-1) is separated from a middle of the transistor M4-1 (i.e., at half of the length L4 of the transistor M4-1) by the distance D3. Also, a middle of the transistor M1-2 (i.e., at half of the length L1 of the transistor M1-2) is separated from a middle of the transistor M4-2 (i.e., at half of the length L4 of the transistor M4-2) by the distance D3. Accordingly, based on the same reason discussed with reference to the distance D2 shown in FIG. 5, the internal resistances (i.e., the resistive element R3) of the conductive wires coupled between the transistors M1-1 and M4-1 is equal to the internal resistance (i.e., the resistive element R4) of the conductive wires coupled between the transistors M1-2 and M4-2.

Figure 7:
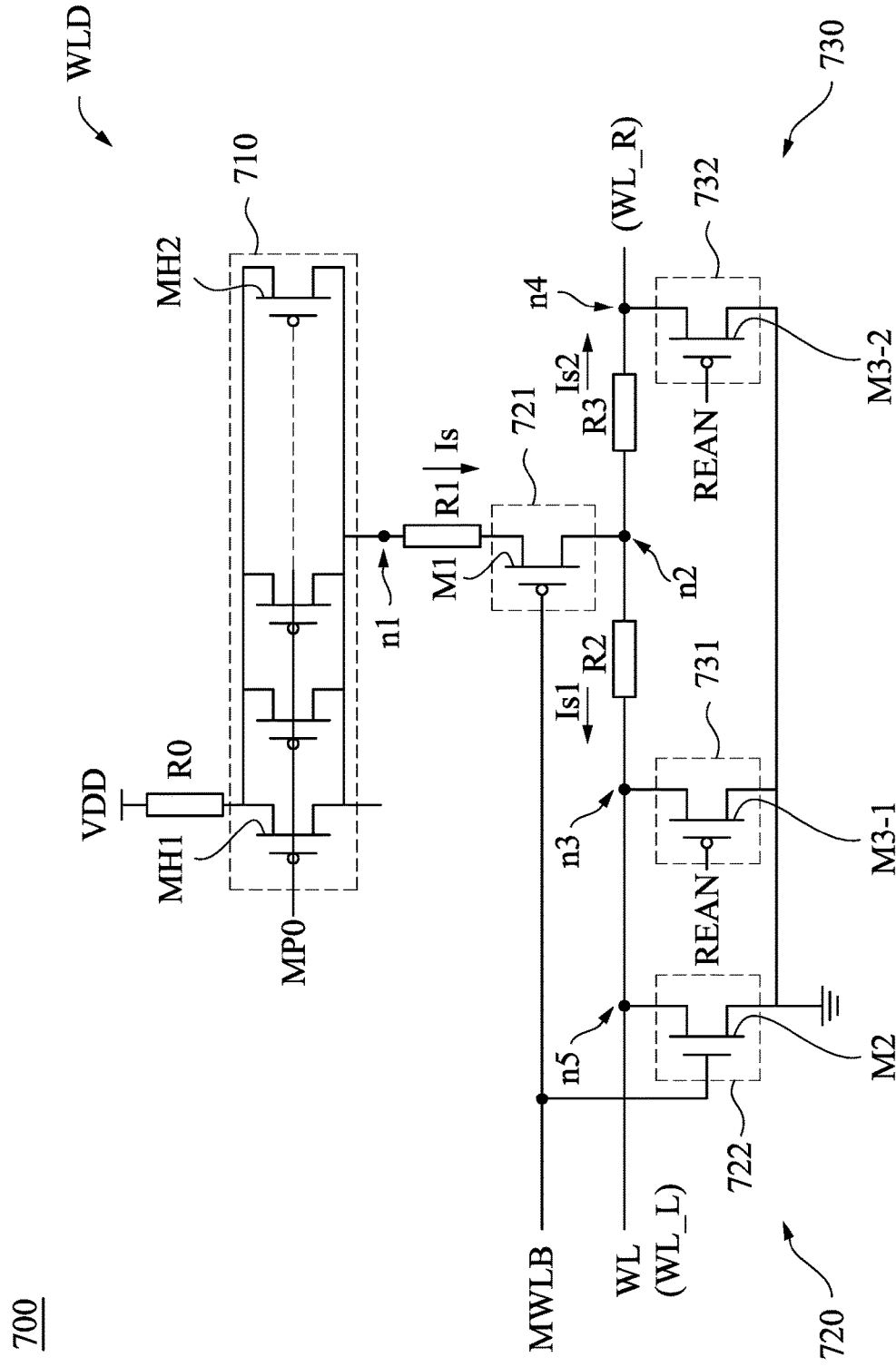
FIG. 7 is an equivalent circuit of a word line driver corresponding to the word line driver shown in FIG. 1, in accordance with some embodiments of the present disclosure.

Reference is made to FIG. 7. FIG. 7 is an equivalent circuit 700 of a word line driver WLD corresponding to the word line driver WLD shown in FIG. 1, in accordance with some embodiments of the present disclosure. The word line driver WLD includes a header circuit 710, a driving circuitry 720 which includes driving circuits 721 and 722, a modulating circuitry 730 which includes modulating circuits 731 and 732, and resistive elements R0, R1, R2 and R3. Configurations and/or relationships between the header circuit 710, the driving circuits 721 and 722 in the embodiments of FIG. 7 are similar to the embodiments of FIG. 2 or FIG. 5 as discussed above. Thus, they are not further detailed herein. The word line driver WLD with respect to the embodiments of FIG. 2 or FIG. 5, like elements in FIG. 7 are designated with the same reference numbers for ease of understanding.

The header circuit 710 is coupled through the resistive element R0 to the supply voltage terminal VDD, and is coupled through the resistive element R1 to the driving circuit 721. The driving circuit 721 is coupled to the driving circuit 722 in parallel, and is coupled through the resistive elements R2 and R3 to the modulating circuits 731 and 732 respectively. The driving circuit 722 is coupled between the output terminal WL_L (i.e., the node n5) and the ground. The modulating circuit 731 is coupled between the node n3 on the word line WL and the ground. The modulating circuit 732 is coupled between the output terminal WL_R (i.e., the node n4) on the word line WL and the ground.

Compared to the embodiments illustrated in FIG. 2, the transistors MH1, . . . , and MH2 included in the equivalent circuit 700 are coupled in parallel, and each drain terminals of the same are further coupled through the node n1 to the driving circuit 721.

The driving circuit 721 includes a transistor M1 which, in some embodiments, is a PMOS transistor, and the driving circuit 722 includes a transistor M2 which, in some embodiments, is a NMOS transistor. A gate terminal of the transistor M1 and a gate terminal of the transistor M2 are coupled together and are further coupled to a word line decoder (not shown), configured to be driven by the word line decoder in response to the decoder signal MWLB. A source terminal of the transistor M1 is coupled through the resistive element R1 to the node n1, for receiving signal output from the header circuit 710. A drain terminal of the transistor M1 is coupled to a node n2 on the word line WL, and is further coupled through the resistive element R2 to a node n3 on the word line, which is also coupled to the modulating circuit 731. Also, a drain terminal of the transistor M1 is coupled to a node n2, and is further coupled through the resistive element R3 to the node n4 (i.e., the output terminal WL_R) which is also coupled to the modulating circuit 732. A source terminal of the transistor M2 is coupled to the node 5 (i.e., the output terminal WL_L). In some embodiments, the transistor M2 and the transistor M1 are configured to operate as an inverter.

In addition, the modulating circuit 731 includes a transistor M3-1 which, in some embodiments, is a PMOS transistor, and the modulating circuit 732 includes a transistor M3-2 which, in some embodiments, is a PMOS transistor. A gate terminal of the transistor M3-1 is coupled to a control circuit (not shown), for receiving a control signal RAEN output from the control circuit. A source terminal of the transistor M3-1 is coupled to the node n3 on the word line WL, and a drain terminal of the transistor M3-1 is coupled to the ground. A gate terminal of the transistor M3-2 is also coupled to the control circuit (not shown), configured to be driven in response to the control signal RAEN. A source terminal of the transistor M3-2 is coupled to the node n4 (i.e., the output terminal WL_R), and a drain terminal of the transistor M3-2 is coupled to the ground.

Furthermore, the resistive element R1 is coupled between the node n1 and the transistor M1. The resistive element R2 is coupled between the node n2 (which is also coupled to the transistor M1) and the node n3 (which is also coupled to the transistor M3-1). The resistive element R3 is coupled between the node n2 (which is also coupled to the transistor M1) and the node n4 (which is also coupled to the transistor M3-2).

In some embodiments, a method for operating the word line driver WLD shown in FIG. 7 is similar to the embodiments of FIG. 3 as discussed above.

For illustration with the operation S310 shown in FIG. 3, similar to the operation S310 with reference to FIG. 2, with reference to FIG. 7, the transistor M1 of the driving circuit 721 is turned on, in response to the decoder signal MWLB, and the word line WL coupled with turn-on transistor M1 is indicated as the selected word line WL.

For illustration in the operation S320 shown in FIG. 3, similar to the operation S320 with reference to FIG. 2, with reference to FIG. 7, the transistors MH1 and MH2 of the header circuit 710 are turned on, in response to the decoder signal MP0. The signal (e.g., the current signal Is) is coupled from the supply voltage terminal VDD through the transistors of the header circuit 710 to the node n1, and further coupled through the resistive element R1 to the transistor M1 of the driving circuit 721.

For illustration in the operation S330 shown in FIG. 3, similar to the operation S330 with reference to FIG. 2, with reference to FIG. 7, the signal Is is transmitted through the transistor M1 to the node n2 on the selected word line WL. Subsequently, the selected word line WL is charged at the node n2, which is further coupled to two separated nodes n5 (i.e., node WL_L) and n4 (i.e., node WL_R) as output terminals of the word line driver WLD.

Since the node n2 is also indicated as a shunt node on the word line WL, the signal Is coupled from the transistor M1 in the operation S330 is split into two parts of signals Is1 and Is2. For illustration in the operation S340 shown in FIG. 3, with reference to FIG. 7, the transistors M3-1 of the modulating circuit 731 and M3-2 of the modulating circuit 732 are turned on, in response to the control signal RAEN. The current signal Is1 is transmitted from the node n2 through the resistive element R2 to the node n3, and further coupled through the transistor M3-1 to the ground. Meanwhile, the current signal Is2 is transmitted from the node n2 through the resistive element R3 to the node n4, and further coupled through transistor M3-2 to the ground. Accordingly, two respective output terminals WL_L and WL_R of the selected word line WL are modulated to having a lower voltage or current value, and the suppressed word line is provided.

Figure 8:
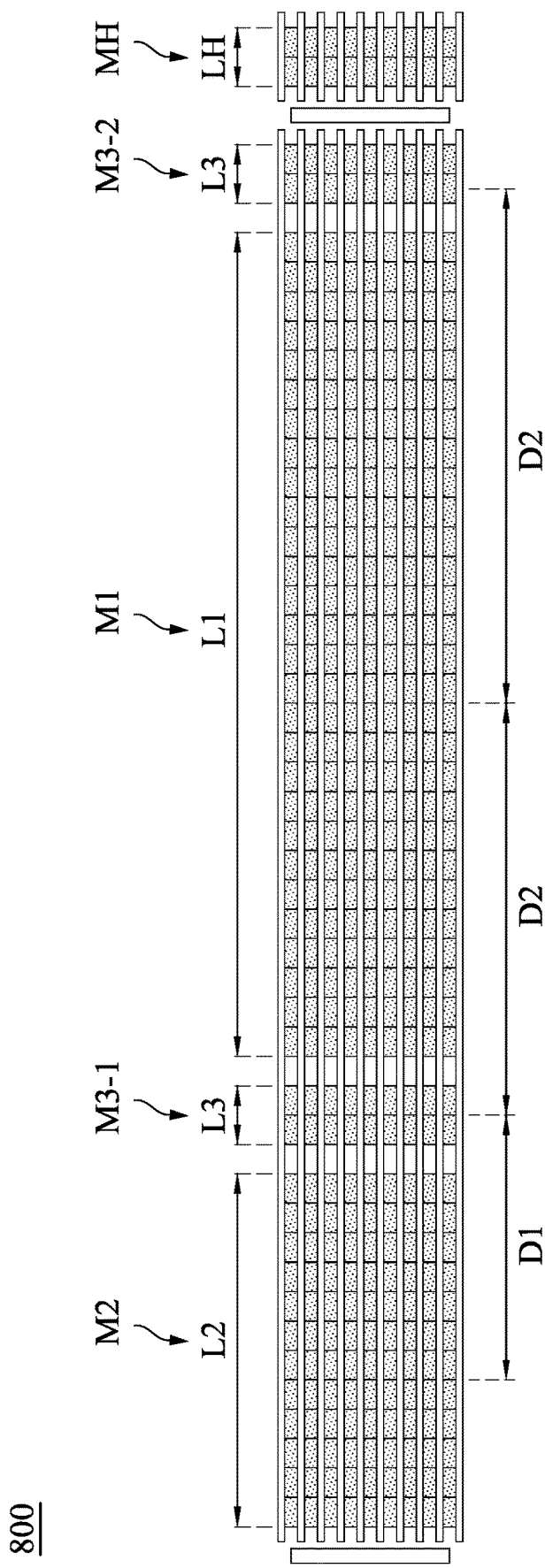
FIG. 8 is a layout diagram of a word line driver corresponding to the word line driver shown in FIG. 7, in accordance with some embodiments of the present disclosure.

Reference is made to FIG. 8. FIG. 8 is a layout diagram 800 of a word line driver corresponding to the word line driver WLD shown in FIG. 7, in accordance with some embodiments of the present disclosure.

For illustration in FIG. 8, the layout structure of the transistor M2 is disposed next to the layout structure of the transistor M3-1. The layout structure of the transistor M3-1 is disposed between the layout structure of the transistor M2 and the layout structure of the transistor M1. The layout structure of the transistor M1 is disposed between the layout structure of the transistor M3-1 and the layout structure of the transistor M3-2. Alternatively stated, the driving circuit M1 is disposed between two separated modulating circuits including the transistors M3-1 and M3-2, in a layout view. The layout structure of the transistor M3-2 is disposed between the layout structure of the transistor M1 and the layout structure of the transistor MH.

In some embodiments, the transistors M2, M3-1, M1, M3-2, and MH have different driving abilities for implementing the corresponding operations discussed above with reference to FIGS. 3 and 7. For example, with reference to FIG. 8, the transistor M2 has a length L2; the transistor M3-1 or M3-2 has a length L3; the transistor M3 has a length L3; and the transistor MH has a length LH.

In some embodiments, at least two of the transistors M2, M3-1, M1, M3-2, and MH have same driving abilities for operating identically. For example, for the layout structures of the transistors shown in FIG. 8, the transistors M3-1 and M3-2 have the same length L3. Therefore, the transistor M3-1 is identical to the transistor M3-2. Accordingly, the internal resistance (i.e., the resistive element R2) of the transistor M3-1 is equal to the same (i.e., the resistive element R3) of the transistor M3-2. In alternative embodiments, the length L2 is as same as the length L1, and the transistors M2, M3-1 and M3-2 are identical to each other.

In some embodiments, the layout structures of the transistors M2, M3-1, M1, M3-2, and MH are separated from each other by different distances, for forming corresponding conductive rails in several metal layers with different routing lengths. For example, for the layout structures of the transistors shown in FIG. 8, a middle of the transistor M2 (i.e., at half of the length L2 of the transistor M2) is separated from a middle of the transistor M3-1 (i.e., at half of the length L3 of the transistor M3-1) by a distance D1. A middle of the transistor M3-1 (i.e., at half of the length L3 of the transistor M3-1) is separated from a middle of the transistor M1 (i.e., at half of the length L1 of the transistor M1) by a distance D2 that is different from the distance D1.

In some embodiments, at least one of the layout structures of the transistors M2, M3-1, M1, M3-2, and MH are separated from each other by a same distance, for forming corresponding conductive rails with the same routing length. For example, for the layout structures of the transistors shown in FIG. 8, a middle of the transistor M1 (i.e., at half of the length L1 of the transistor M1) is separated from a middle of the transistor M3-2 (i.e., at half of the length L3 of the transistor M3-2) by the distance D2. Therefore, a conductive rail coupled between the transistor M1 and the transistor M3-1 has a length which is the same as a length of a conductive rail coupled between the transistor M1 and the transistor M3-2, and is substantially equal to the distance D2. Accordingly, the internal resistance R2 of the conductive wires coupled between the transistors M1 and M3-1 is equal to the internal resistance R3 of the conductive wires coupled between the transistors M1 and M3-2.

Figure 9:
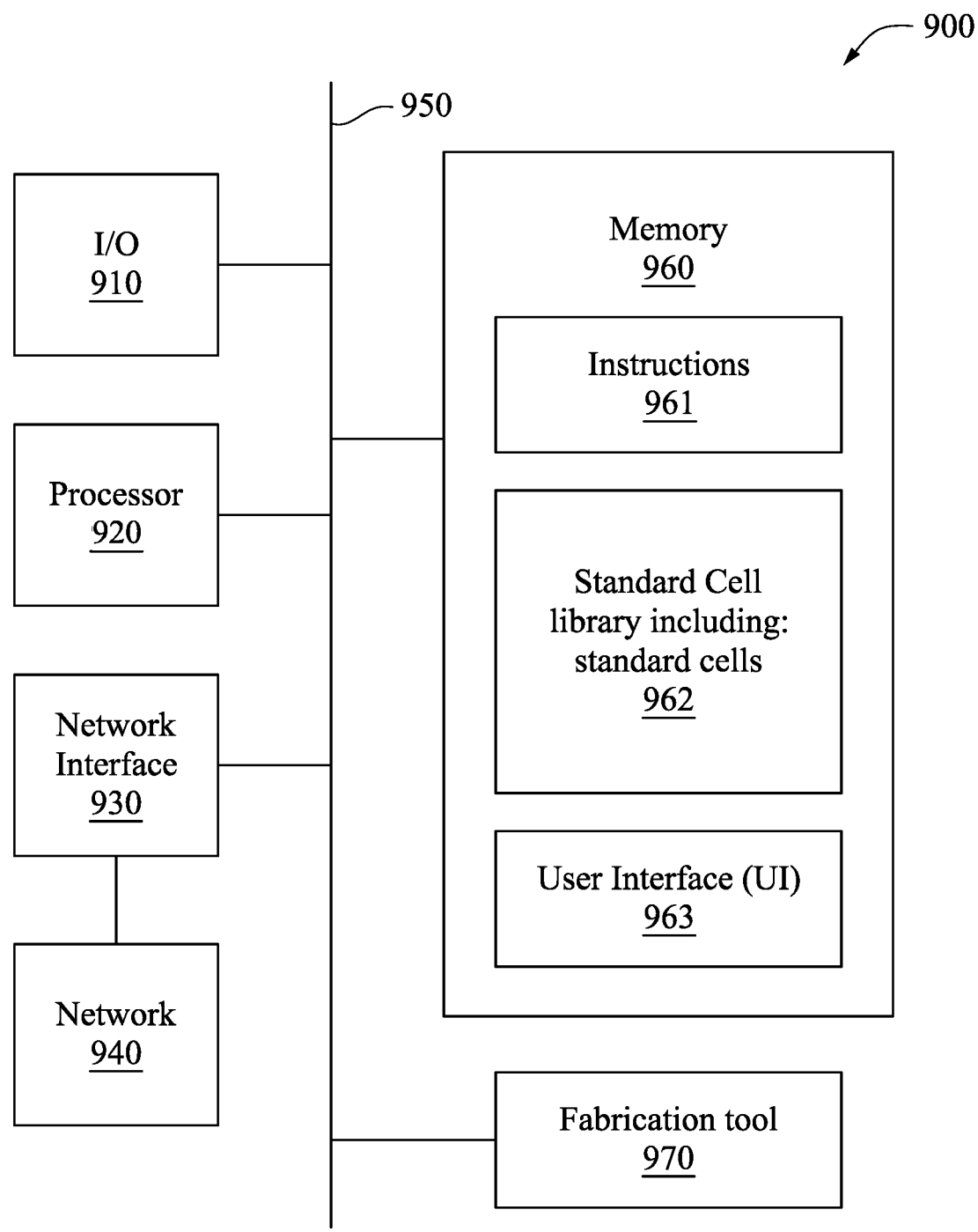
FIG. 9 is a block diagram of a system for designing an IC layout design, in accordance with some embodiments of the present disclosure.

Reference is now made to FIG. 9. FIG. 9 is a block diagram of electronic design automation (EDA) system 900 for designing the integrated circuit layout design, in accordance with some embodiments of the present disclosure. EDA system 900 is configured to implement one or more operations of the method 300 disclosed in FIG. 3, and further explained in conjunction with FIGS. 2-8. In some embodiments, EDA system 900 includes an APR system.

In some embodiments, EDA system 900 is a general purpose computing device including a hardware processor 920 and a non-transitory, computer-readable storage medium 960. Storage medium 960, amongst other things, is encoded with, i.e., stores, computer program code (instructions) 961, i.e., a set of executable instructions. Execution of instructions 961 by hardware processor 920 represents (at least in part) an EDA tool which implements a portion or all of, e.g., the method 300.

The processor 920 is electrically coupled to computer-readable storage medium 960 via a bus 950. The processor 920 is also electrically coupled to an I/O interface 910 and an fabrication tool 970 by bus 950. A network interface 930 is also electrically connected to processor 920 via bus 950. Network interface 930 is connected to a network 940, so that processor 920 and computer-readable storage medium 960 are capable of connecting to external elements via network 940. The processor 920 is configured to execute computer program code 961 encoded in computer-readable storage medium 960 in order to cause EDA system 900 to be usable for performing a portion or all of the noted processes and/or methods. In one or more embodiments, processor 920 is a central processing unit (CPU), a multi-processor, a distributed processing system, an application specific integrated circuit (ASIC), and/or a suitable processing unit.

In one or more embodiments, computer-readable storage medium 960 is an electronic, magnetic, optical, electromagnetic, infrared, and/or a semiconductor system (or apparatus or device). For example, computer-readable storage medium 960 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 960 includes a compact disk-read only memory (CD-ROM), a compact disk-read/write (CD-R/W), and/or a digital video disc (DVD).

In one or more embodiments, storage medium 960 stores computer program code 961 configured to cause EDA system 900 (where such execution represents (at least in part) the EDA tool) to be usable for performing a portion or all of the noted processes and/or methods. In one or more embodiments, storage medium 960 also stores information which facilitates performing a portion or all of the noted processes and/or methods. In one or more embodiments, storage medium 960 stores library 962 of standard cells including such standard cells as disclosed herein, for example, memory cells MC included in the array of memory cells 110 or 120 discussed above with respect to FIG. 1.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 920.

EDA system 900 also includes network interface 930 coupled to processor 920. Network interface 930 allows EDA system 900 to communicate with network 940, to which one or more other computer systems are connected. Network interface 930 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 900.

EDA system 900 also includes the fabrication tool 970 coupled to the processor 920. The fabrication tool 970 is configured to fabricate integrated circuits, including, for example, the memory device 100 illustrated in FIG. 1, based on the design files processed by the processor 920 and/or the IC layout designs as discussed above.

EDA system 900 is configured to receive information through I/O interface 910. The information received through I/O interface 910 includes one or more of instructions, data, design rules, libraries of standard cells, and/or other parameters for processing by processor 920. The information is transferred to processor 920 via bus 950. EDA system 900 is configured to receive information related to a UI through I/O interface 910. The information is stored in computer-readable medium 960 as user interface (UI) 963.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 10:
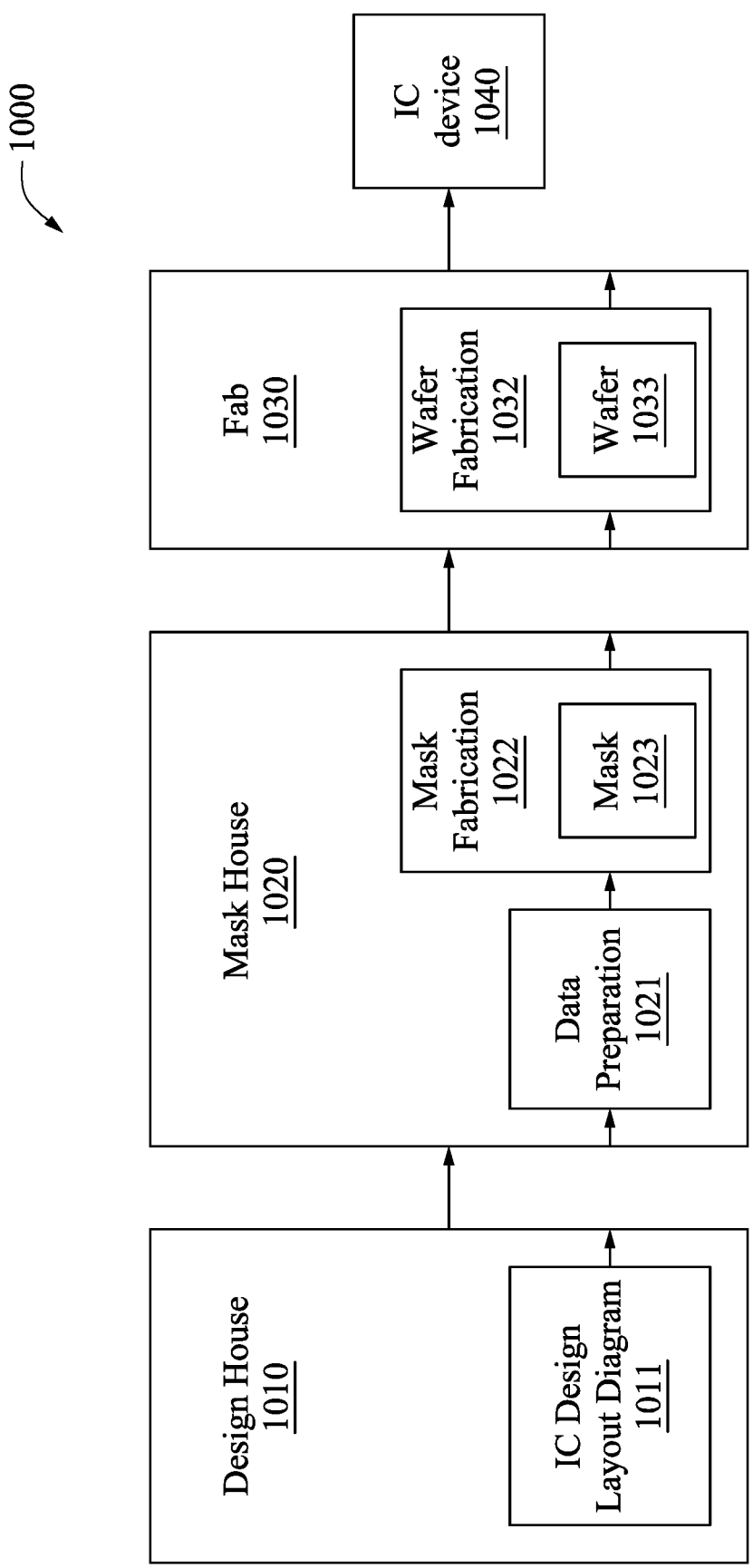
FIG. 10 is a block diagram of an IC manufacturing system, and an IC manufacturing flow associated therewith, in accordance with some embodiments.

FIG. 10 is a block diagram of IC manufacturing system 1000, and an IC manufacturing flow associated therewith, in accordance with some embodiments of the present disclosure. In some embodiments, based on a layout diagram, at least one of (A) one or more semiconductor masks or (B) at least one component in a layer of a semiconductor integrated circuit is fabricated using IC manufacturing system 1000.

In FIG. 10, IC manufacturing system 1000 includes entities, such as a design house 1010, a mask house 1020, and an IC manufacturer/fabricator ("fab") 1030, that interact with one another in the design, development, and manufacturing cycles and/or services related to manufacturing an IC device 1040. The entities in IC manufacturing system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1010, mask house 1020, and IC fab 1030 is owned by a single larger company. In some embodiments, two or more of design house 1010, mask house 1020, and IC fab 1030 coexist in a common facility and use common resources.

Design house (or design team) 1010 generates an IC design layout diagram 1011. IC design layout diagram 1011 includes various geometrical patterns, for example, an IC layout design depicted in FIGS. 4, 6 and/or FIG. 8, designed for an IC device 1040, for example, word line driver WLD, discussed above with respect to FIG. 2, FIG. 5, and/or FIG. 7 included in the memory device 100 illustrated in FIG. 1. The geometrical patterns correspond to patterns of metal, oxide, or semiconductor layers that make up the various components of IC device 1040 to be fabricated. The various layers combine to form various IC features. For example, a portion of IC design layout diagram 1011 includes various IC features, such as an fin, gate electrode, source and drain, conductive segments or vias of an interlayer interconnection, to be formed in a semiconductor substrate (such as a silicon wafer) and various material layers disposed on the semiconductor substrate. Design house 1010 implements a proper design procedure to form IC design layout diagram 1011. The design procedure includes one or more of logic design, physical design or place and route. IC design layout diagram 1011 is presented in one or more data files having information of the geometrical patterns. For example, IC design layout diagram 1011 can be expressed in a GDSII file format or DFII file format.

Mask house 1020 includes mask data preparation 1021 and mask fabrication 1022. Mask house 1020 uses IC design layout diagram 1011 to manufacture one or more masks 1023 to be used for fabricating the various layers of IC device 1040 according to IC design layout diagram 1011. Mask house 1020 performs mask data preparation 1021, where IC design layout diagram 1011 is translated into a representative data file ("RDF"). Mask data preparation 1021 provides the RDF to mask fabrication 1022. Mask fabrication 1022 includes a mask writer. A mask writer converts the RDF to an image on a substrate, such as a mask (reticle) 1023 or a semiconductor wafer 1033. The IC design layout diagram 1011 is manipulated by mask data preparation 1021 to comply with particular characteristics of the mask writer and/or requirements of IC fab 1030. In FIG. 10, mask data preparation 1021 and mask fabrication 1022 are illustrated as separate elements. In some embodiments, mask data preparation 1021 and mask fabrication 1022 can be collectively referred to as mask data preparation.

In some embodiments, mask data preparation 1021 includes optical proximity correction (OPC) which uses lithography enhancement techniques to compensate for image errors, such as those that can arise from diffraction, interference, other process effects and the like. OPC adjusts IC design layout diagram 1011. In some embodiments, data preparation 1021 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1021 includes a mask rule checker (MRC) that checks the IC design layout diagram 1011 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1011 to compensate for limitations during mask fabrication 1022, which may undo part of the modifications performed by OPC in order to meet mask creation rules.

In some embodiments, data preparation 1021 includes lithography process checking (LPC) that simulates processing that will be implemented by IC fab 1030 to fabricate IC device 1040. LPC simulates this processing based on IC design layout diagram 1011 to create a simulated manufactured device, such as IC device 1040. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1011.

It should be understood that the above description of data preparation 1021 has been simplified for the purposes of clarity. In some embodiments, data preparation 1021 includes additional features such as a logic operation (LOP) to modify the IC design layout diagram 1011 according to manufacturing rules. Additionally, the processes applied to IC design layout diagram 1011 during data preparation 1021 may be executed in a variety of different orders.

After data preparation 1021 and during mask fabrication 1022, a mask 1023 or a group of masks 1023 are fabricated based on the modified IC design layout diagram 1011. In some embodiments, mask fabrication 1022 includes performing one or more lithographic exposures based on IC design layout diagram 1011. In some embodiments, an electron-beam (e-beam) or a mechanism of multiple e-beams is used to form a pattern on a mask (photomask or reticle) 1023 based on the modified IC design layout diagram 1011. Mask 1023 can be formed in various technologies. In some embodiments, mask 1023 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1023 includes a transparent substrate (for example, fused quartz) and an opaque material (for example, chromium) coated in the opaque regions of the binary mask. In another example, mask 1023 is formed using a phase shift technology. In a phase shift mask (PSM) version of mask 1023, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1022 is used in a variety of processes. For example, such a mask(s) is used in an ion implantation process to form various doped regions in semiconductor wafer 1033, in an etching process to form various etching regions in semiconductor wafer 1033, and/or in other suitable processes.

IC fab 1030 includes wafer fabrication 1032. IC fab 1030 is an IC fabrication business that includes one or more manufacturing facilities for the fabrication of a variety of different IC products. In some embodiments, IC fab 1030 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1030 uses mask(s) 1023 fabricated by mask house 1020 to fabricate IC device 1040. Thus, IC fab 1030 at least indirectly uses IC design layout diagram 1011 to fabricate IC device 1040. In some embodiments, semiconductor wafer 1033 is fabricated by IC fab 1030 using mask(s) 1023 to form IC device 1040. In some embodiments, the IC fabrication includes performing one or more lithographic exposures based at least indirectly on IC design layout diagram 1011. Semiconductor wafer 1033 includes a silicon substrate or other proper substrate having material layers formed thereon. Semiconductor wafer 1033 further includes one or more of various doped regions, dielectric features, multi-level interconnects, and the like (formed at subsequent manufacturing steps).

Furthermore, in some embodiments of the present disclosure, at least one of the transistors is implemented with at least one metal oxide semiconductor (MOS) transistor, at least one bipolar junction transistor (BJT), etc., or the combination thereof. Various circuits or devices to implement the transistors in the aforementioned embodiments are within the contemplated scope of the present disclosure.

Also disclosed is a memory device which includes a first transistor, a second transistor and a third transistor. The first transistor is coupled to a first word line at a first node. The second transistor is coupled to a second word line different from the first word line at a second node. A control terminal of the first transistor is coupled to a control terminal of the second transistor. The third transistor is coupled between a ground and a third node which is coupled to each of the first node and the second node. In a layout view, each of the first transistor and the second transistor has a first length along a direction. The first transistor, the third transistor and second transistor are arranged in order along the direction.

Also disclosed is a memory device which includes first memory cells, second memory cells, a first switch and a second switch. The first memory cells are coupled to a first node. The second memory cells are different from the plurality of first memory cells and coupled to a second node. The first switch is configured to receive a first current signal from a third node at the first node, and configured to be controlled by a first control signal. The second switch is configured to receive a second current signal from the third node at the second node, and configured to be controlled by the first control signal. A current level of the first current signal is substantially equal to a current level of the second current signal. Each of the first switch and the second switch is coupled to a reference voltage terminal.

Also disclosed is a method including: controlling a first switch coupled between a first word line and a reference voltage terminal by a first control signal; controlling a second switch coupled between the first word line and the reference voltage terminal by the first control signal; and controlling a third switch coupled between the first word line and the reference voltage terminal by a second control signal. A logic value of the first control signal is complementary with a logic value of the second control signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a first transistor coupled to a first word line at a first node;
    a second transistor coupled to a second word line different from the first word line at a second node, wherein a control terminal of the first transistor is coupled to a control terminal of the second transistor; and
    a third transistor coupled between a ground and a third node which is coupled to each of the first node and the second node,
    wherein in a layout view, each of the first transistor and the second transistor has a first length along a direction, and
    the first transistor, the third transistor and second transistor are arranged in order along the direction.

2. The memory device of claim 1, wherein in the layout view, the third transistor has a second length along the direction, and
    the first length is larger than the second length.

3. The memory device of claim 1, further comprising:
    a fourth transistor coupled to the ground, the first node and the control terminal of the first transistor,
    wherein in the layout view, the third transistor has a second length along the direction, and
    the first length is substantially equal to the second length.

4. The memory device of claim 1, wherein in the layout view, a distance from a middle of the first transistor to a middle of the third transistor is substantially equal to a distance from a middle of the second transistor to the middle of the third transistor.

5. The memory device of claim 1, further comprising:
    a plurality of fourth transistors coupled parallel and coupled to each of the first transistor and the second transistor, and having a second length smaller than the first length along the direction,
    wherein the second transistor is disposed between the third transistor and the plurality of fourth transistors in the layout view.

6. The memory device of claim 1, further comprising:
    a fourth transistor coupled between the ground and a fourth node which is coupled to each of the first node and the third node,
    wherein in the layout view, along the direction, a length of the fourth transistor is substantially equal to a length of the third transistor, and
    in the layout view, along the direction, the fourth transistor is disposed between the first transistor and the third transistor.

7. The memory device of claim 6, further comprising:
    a fifth transistor coupled between the ground and a fifth node which is coupled to each of the second node and the third node,
    wherein in the layout view, along the direction, a length of the fifth transistor is substantially equal to the length of the fourth transistor, and
    in the layout view, along the direction, the fifth transistor is disposed between the second transistor and the third transistor.

8. A memory device, comprising:
    a plurality of first memory cells coupled to a first node;
    a plurality of second memory cells that are different from the plurality of first memory cells and coupled to a second node;

a first switch configured to receive a first current signal from a third node at the first node, and configured to be controlled by a first control signal; and a second switch configured to receive a second current signal from the third node at the second node, and configured to be controlled by the first control signal, wherein a current level of the first current signal is substantially equal to a current level of the second current signal, and each of the first switch and the second switch is coupled to a reference voltage terminal.

9. The memory device of claim 8, further comprising:

a third switch coupled in series with each of the first switch and the second switch, and configured to provide a third current which is split into the first current and the second current at the third node.

10. The memory device of claim 9, wherein in a layout view, along a direction, a distance between a middle of the third switch to a middle of the first switch is substantially equal to a distance between the middle of the third switch to a middle of the second switch.

11. The memory device of claim 10, wherein in the layout view, along the direction, a length of the first switch is substantially equal to a length of the second switch and is smaller than a length of the third switch.

12. The memory device of claim 9, further comprising:

a fourth switch coupled to the first node and configured to operate with the third switch as an inverter.

13. The memory device of claim 12, wherein in a layout view, along a direction, a length of the third switch is substantially equal to a length of the fourth switch, and in the layout view, along the direction, the first switch is disposed between the third switch and the fourth switch.

14. The memory device of claim 13, further comprising:

a plurality of fourth switches each coupled in series with the third switch, wherein in the layout view, along the direction, the second switch is disposed between the third switch and the plurality of fourth switches.

15. A method, comprising:

controlling a first switch coupled between a first word line and a reference voltage terminal by a first control signal;

controlling a second switch coupled between the first word line and the reference voltage terminal by the first control signal; and controlling a third switch coupled between the first word line and the reference voltage terminal by a second control signal, wherein a logic value of the first control signal is complementary with a logic value of the second control signal.

16. The method of claim 15, further comprising:

controlling a fourth switch coupled in series with the first switch by a third control signal; and controlling a fifth switch coupled in series with the second switch by the third control signal.

17. The method of claim 16, further comprising:

controlling a sixth switch coupled between the reference voltage terminal and the fourth switch by the third control signal.

18. The method of claim 16, further comprising:

transmitting a first current signal from the fourth switch through a first resistor to the first switch; and transmitting a second current signal from the fifth switch through a second resistor to the first switch, wherein the first resistor is substantially identical to the second resistor, and the first current signal is substantially equal to the second current signal.

19. The method of claim 18, further comprising:

coupling the first current signal and the second current signal together as a third current signal; and transmitting the third current signal to the reference voltage terminal by the third switch.

20. The method of claim 18, further comprising:

providing the first current signal by a plurality of sixth switches through a third resistor to the fourth switch; and providing the second current signal by the plurality of sixth switches through a fourth resistor to the fifth switch, wherein the plurality of sixth switches are coupled in parallel, and the third resistor is substantially identical to the fourth resistor.

* * * * *